United States Patent [19]

Poirier et al.

[11] 4,103,333

[45] Jul. 25, 1978

[54] CHARGE COUPLED CORRELATOR DEVICE

[75] Inventors: Raymond Poirier; Yves Hubert; Noureddine Lakhoua, all of Paris, France

[73] Assignee: Thomson-CSF, Paris, France

[21] Appl. No.: 762,795

[22] Filed: Jan. 25, 1977

[30] Foreign Application Priority Data

Jan. 30, 1976 [FR] France ................... 76 02584

[51] Int. Cl.[2] ........................................... G06G 7/19
[52] U.S. Cl. ........................... 364/824; 307/221 D; 357/24; 364/862
[58] Field of Search ................ 235/181, 197, 193; 357/24; 307/221 C, 221 D; 364/819–824, 862, 861

[56] References Cited

U.S. PATENT DOCUMENTS

| | | | |
|---|---|---|---|
| 3,903,406 | 9/1975 | London | 235/181 |
| 3,935,439 | 1/1976 | Buss et al. | 235/181 |
| 3,940,602 | 2/1976 | Lagnado et al. | 235/181 |
| 3,961,171 | 6/1976 | Freeman | 235/181 |
| 3,987,293 | 10/1976 | Crooke et al. | 235/193 |
| 4,031,490 | 6/1977 | Copeland | 235/181 |

*Primary Examiner*—Felix D. Gruber
*Attorney, Agent, or Firm*—Cushman, Darby & Cushman

[57] ABSTRACT

A charge coupled correlator device with two pairs of registers connected in parallel, each register comprising a succession of stages through which charges pass and in each stage at least one phase and output electrode. The electrodes of the second register have small dimensions compared with those of the first. The outputs of two such devices are subtracted to produce a correlation product.

6 Claims, 6 Drawing Figures

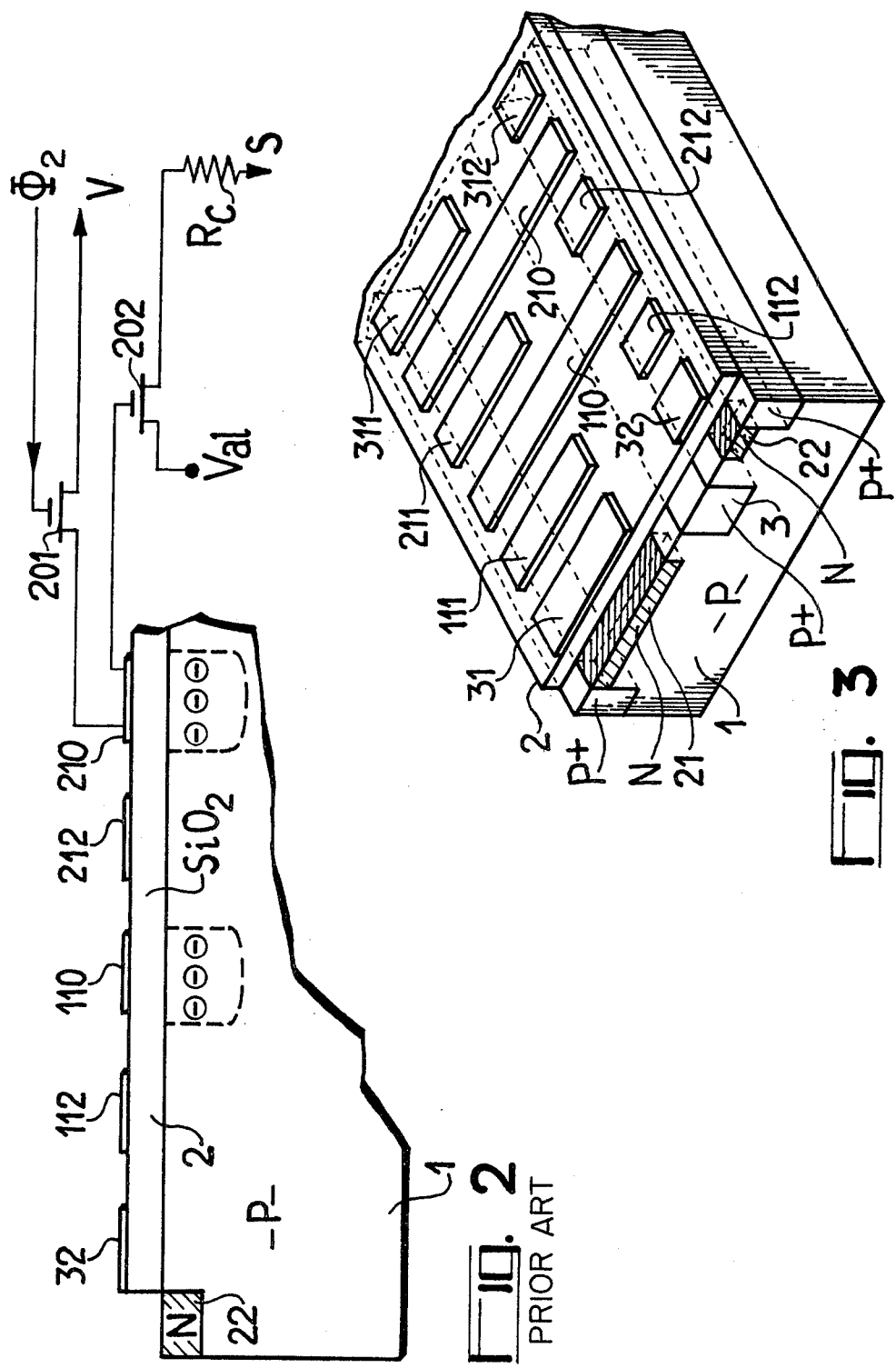

CHARGE COUPLED CORRELATOR DEVICE

The present invention relates to a novel correlator device using the charge coupled device effect, which makes it possible to form the correlation product P, of two signals $S_1$ and $S_2$, the signal $S_1$ being stored and the signal $S_2$ varying with time.

The device in accordance with the invention is applicable in particular to analogue signals and utilises the properties of charge coupled device registers, normally referred to C.C.D.'s. Those skilled in the art will appreciate that registers of this kind are the analogue equivalents of logic shift registers. They have several stages; each stage contains an analogue signal. Under the effect of clock pulses, each stage transfers the signal which it is storing, to the following one, whilst on the other hand the first stage, at each clock pulse, receives the instantaneous value of the signal which is to be stored, and which, by definition, is a function of time.

Charge coupled correlators have already been proposed. Generally, they are complicated and do not directly furnish the correlation product.

The charge coupled correlator device in accordance with the invention is of the kind comprising two charge coupled registers, the first receiving the stored signal and the second the time-variable signal.

It is essentially characterized by the fact that the transfer electrodes of the second register have must smaller dimensions than those of the first.

The invention will be better understood from a consideration of the ensuring description and by reference to the attached drawings in which:

FIG. 2 illustrates a sectional view of a stage of a CCD register of the prior art;

FIG. 3 illustrates a perspective view of an embodiment of the correlator in accordance with the invention;

FIG. 1 illustrates the block diagram of a correlator capable of forming the correlation product of two signals $S_1$ and $S_2$, one of these $S_2$ varying constantly as a function of time and the other, $S_1$ being stored.

Figure 1:
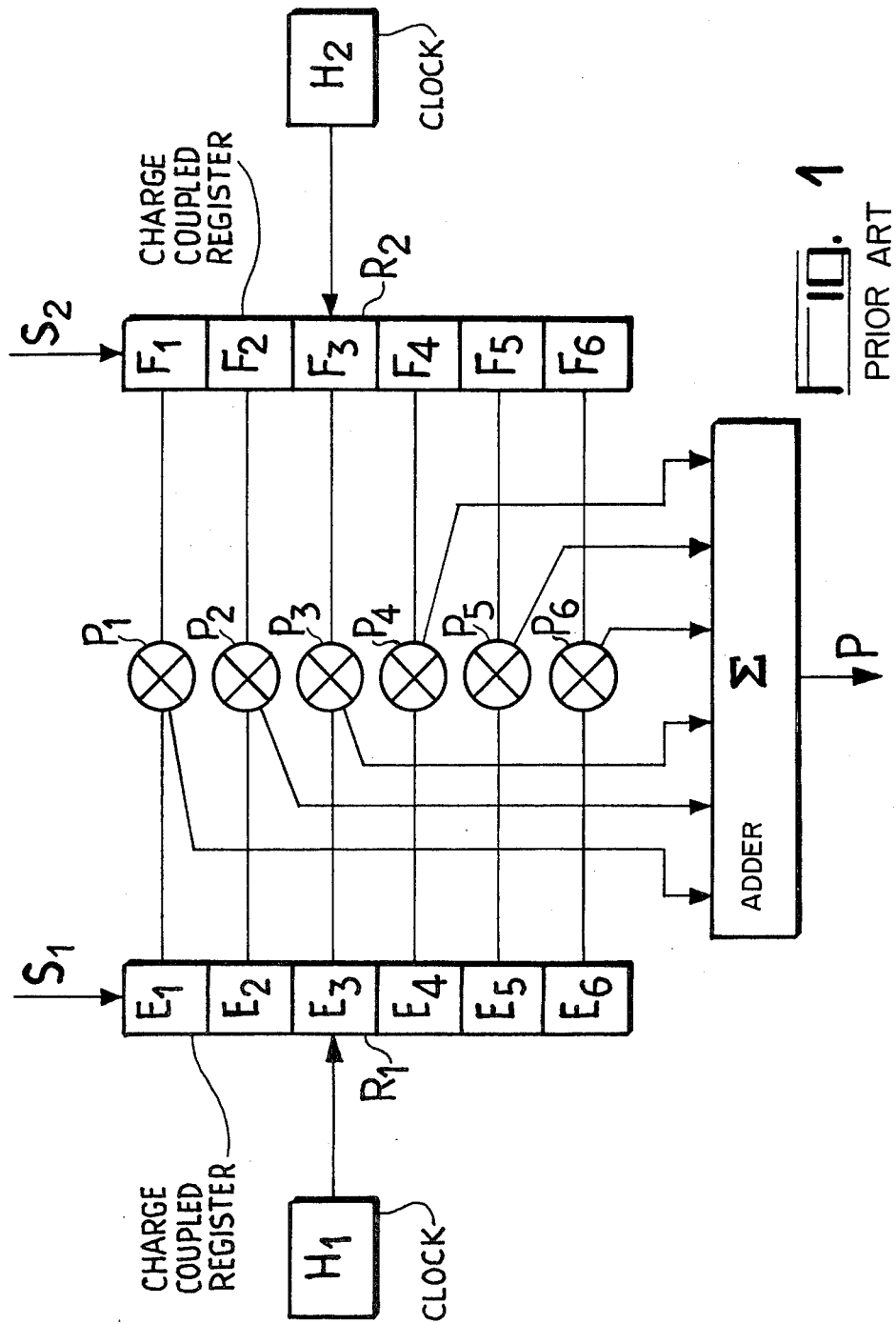
FIG. 1 is a block diagram of a conventional correlator.

The diagram shows two shift-registers $R_1$ and $R_2$ of the charge coupled device kind (CCD) referred to earlier on.

These two registers are each controlled by a clock ($H_1$ and $H_2$) and are supplied at their inputs with analogue signals $S_1$ and $S_2$. In each register, with each clock pulse on the one hand the signal $S_1$ or $S_2$ sampled at the time t is stored in the first stage, and on the other hand the signal $S_1$ or $S_2$ recorded at the time $t - T$ (T periodicity of both clock pulses), is shifted to the next stage. In the case of the invention, once all the stages of the register $R_1$ are filled, that is to say after six clock pulses, the register $R_1$ ceases to receive information. It thus stores the signal $S_1$, that is to say the values which the latter had at the times $t$, $t - T$, ... $t - 6T$.

The register $R_2$ continues to operate at the rate T of its associated clock. The stages $E_p$ and $F_p$ of the registers $R_1$ and $R_2$ are connected to the two inputs of a multiplier $P_p$ ($p = 1, 2, 3, 4, 5$ and 6) whose outputs are connected to the 6 inputs of an adder $\Sigma$.

The output P (t) of this adder can be written as $$P(t) = \Sigma\, s_2(t - \frac{x}{v})\, s_1(x)$$

with $x = 1, 2 \ldots p$ $S_1$ and $S_2$ being respectively equal to $s_1 + D/2$, $s_2 + D/2$, D being a constant, which will be defined hereinafter. $x$ being capable of acquiring any value from 1 to 6 in the chosen example and v being the velocity of propagation of the signal in the register $R_2$, that is to say the reciprocal of T, T being its clock periodicity, so that it is equally possible to state the equation as $$P(t) = \Sigma\, S_2(t - xT)\, S_1(X).\ x = 1 \ldots 6$$

The present invention relates to the design of a device of this kind using two charge transfer registers.

FIG. 2 illustrates a longitudinal section through a register stage of the kind used in the device in accordance with the prior art.

FIG. 3 illustrates a perspective view of this kind of register in accordance with the invention.

The two registers each comprise the same semiconductor substrate 1 which has a certain conductivity type. On this substrate, there is deposited an oxide layer 2, in fact a silica layer $SiO_2$. The substrate is made of silicon and the said layer only covers the right hand side of the substrate. The substrate will for example be a P-type material. In that region of the substrate not covered by oxide, there are diffused or implanted two regions of opposite conductivity type, namely N-type in the present instance, that is to say zones 21 and 22 which form rectifying junctions (diodes) with the substrate. To these diodes there are applied the signals $S_1$ and $S_2$ which reverse-bias the two diodes, namely $S_1 = D/2 + s_1$, $S_2 = D/2 + s_2$. D being a constant voltage, $s_1$ and $s_2$ varying as a function of time.

Into the substrate, between the two registers, there are diffused insulating bands (of P+ material), 3, extending over the surface of the substrate parallel to the major sides thereof, the substrate taking the form of an elongated parallelepiped. These form an insulating wall electrically insulating the two registers from one another. On the oxide surface 2 there are deposited, in each register, metallised bands each of which forms in relation to the substrate an MOS type structure (metal-oxide-semiconductor). The two registers are assumed to be of the so-called "two-phase" type.

Each first of all comprises an input gate, 31 in the case of the register $R_1$, 32 in the case of that $R_2$. The gate is connected to the synchronising clock of the corresponding register.

These are followed on the two registers by the phase electrodes 111, 112 for the respective first stages of the two registers, a common output electrode 110 for the two stages, the electrodes 211, 212 for the two second stages, and that 210 which is an output electrode, etcetera, . . .

In the case shown in FIG. 2, the electrode 210 is connected to the source of a first MOS transistor 201 whose drain is connected to the common bias source of the output electrodes, and the gate is supplied from the clock with control pulses $\phi_s$ enabling the transistor to be unblocked. The same applies to the electrodes 110, 310, etcetera . . . The gate is placed at a fixed potential during the pulses $\phi_s$ and its potential floats for the remainder of the time. It is the variations in this potential which ultimately furnish the output signal. When the gate is at the fixed potential the transistor 201 is conductive and the electrode 210 is at the potential V.

The output signal is picked off from the gate of a second transistor 202 whose source is connected to the output of the stage, and whose drain is connected to a supply battery $V_{al}$.

Figure 4:
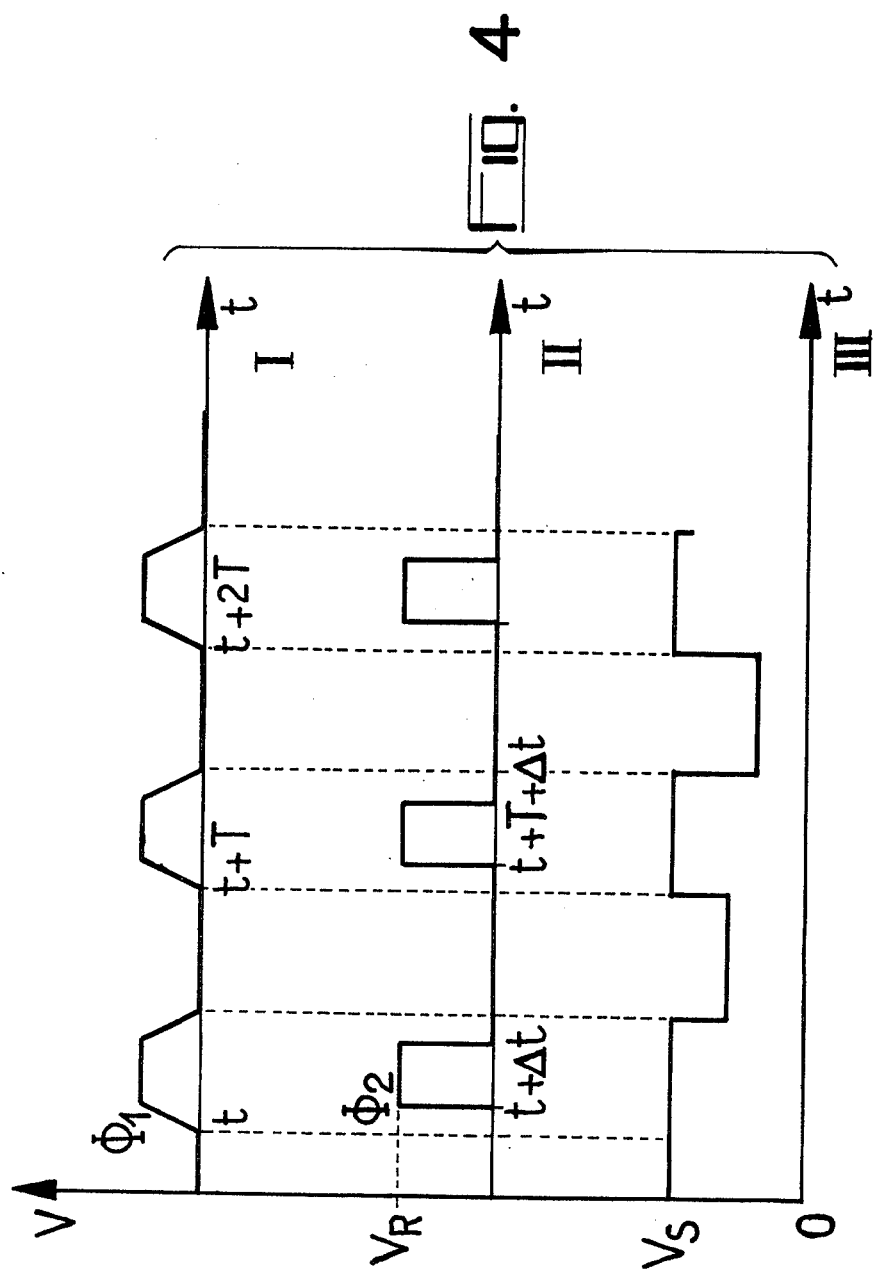
FIG. 4 is a diagram illustrating, as a function of time, the various input signals to the device.

The operating of the system will be understood from a consideration of the time diagram of FIG. 4.

At the times $t + T$, $t + 2T$, $T + nT$, positive pulses $\phi_1$ are applied to the electrode 211. These pulses are responsible for charge transfer from the preceding stage to the next.

The pulses have an amplitude of 2 V. The charges stored in the preceding stage move into the potential well thus created beneath this electrode.

The pulses all have the same duration, namely T.

At the times $t + \Delta T$, $t + T + \Delta T$ pulses $\phi_2$ are applied to the gate of the transistor 201 for a time $T_2$. The electrode 210 which is normally at a floating potential, is connected to its supply source. At the end of the pulses $\phi_1$, the electrode is disconnected and the charges encounter a potential well beneath the electrode 210, the capacitor which the latter forms with the silica layer and substrate not yet being discharged due to the presence of leakage resistances.

The potential $V_s$ on the electrode 210 then floats and acquires a value $V - \Delta V$, where $\Delta V$ is a function of the quantity of free charges coming from the electrode 211 as we shall see at a later point in this description.

This output voltage controls the gate of the transistor 202 and causes its conductivity to vary. The variable voltage $V_s$ (graph III), is converted into a variable current $I_s$ by a resistor $R_c$.

Figure 5:
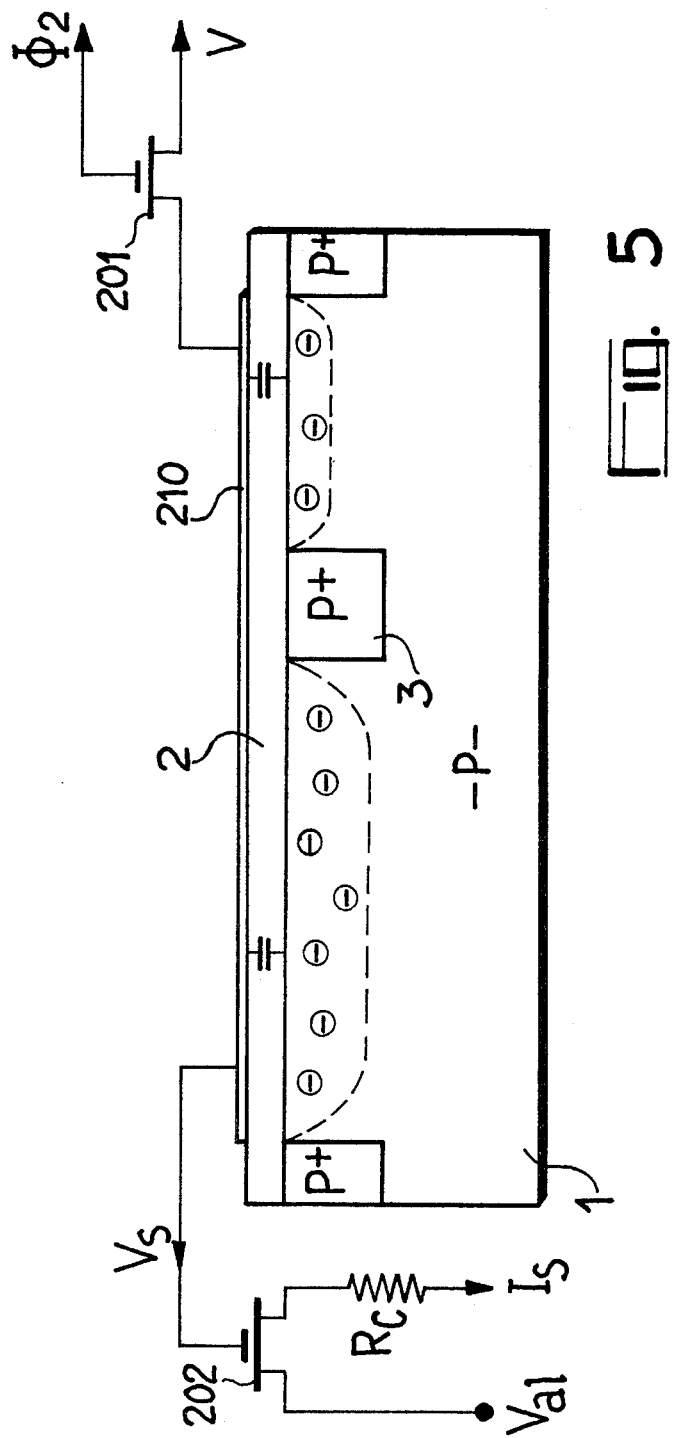
FIG. 5 is a cross-section, at the level of an output electrode, through the register in accordance with the invention.

The mechanism of the device in accordance with the invention can be seen from a consideration of FIG. 5 which represents, in cross-section, the device shown in FIG. 3 at the level of the electrode 210. Beneath the oxide layer, there can be seen two depletion zones created respectively by the signals $D/2 + s_1$, $D/2 + s_2$.

The result is two capacitors $C_1$ and $C_2$ whose respective electrodes are constituted by the metal layer 210 and the two empty zones corresponding in the one case to $S_1$, which is constant, and in the other to $S_2$ which varies with each clock interval.

It will be assumed that these empty zones have a potential of the same mean value $D/2$, and the same maximum value D.

The appearance of the signal $S_2$ beneath the electrode 210 corresponds with an electrical charge $\Delta Q$ so that we have $\Delta Q = C_2(D/(2) + s_2)$.

In accordance with the invention, the electrodes supplied with the time-variable signal have dimensions of the order of ten times less than those receiving the fixed signal, so that we have the relationship $C_1 \gg C_2$.

With this charge $\Delta Q$ there corresponds a potential variation of the electrode 210, of $$\Delta V = \frac{\Delta Q}{C}$$

where C is the total capacitance of the half-pitch of the register (corresponding to the electrode 210), this giving $$\frac{1}{C} = \frac{1}{C_1} + K\sqrt{\frac{D}{2} + s_1}$$

and, if $s_1$ is not too large, $$\frac{1}{C} = \frac{1}{C_1} + K'(1 + \frac{s_1}{D})$$

$$\Delta V = C_2(\frac{D}{2} + s_2)\left[\frac{1}{C_1} + K'(1 + \frac{s_1}{D})\right]$$

and $$\Delta V = C_2\frac{D}{2}\left[\frac{1}{C_1} + K'(1 + \frac{s_1}{D})\right]$$
$$+ C_2 s_2(\frac{1}{C_1} + K') + C_2\frac{K'}{D}s_1 s_2$$

Figure 6:
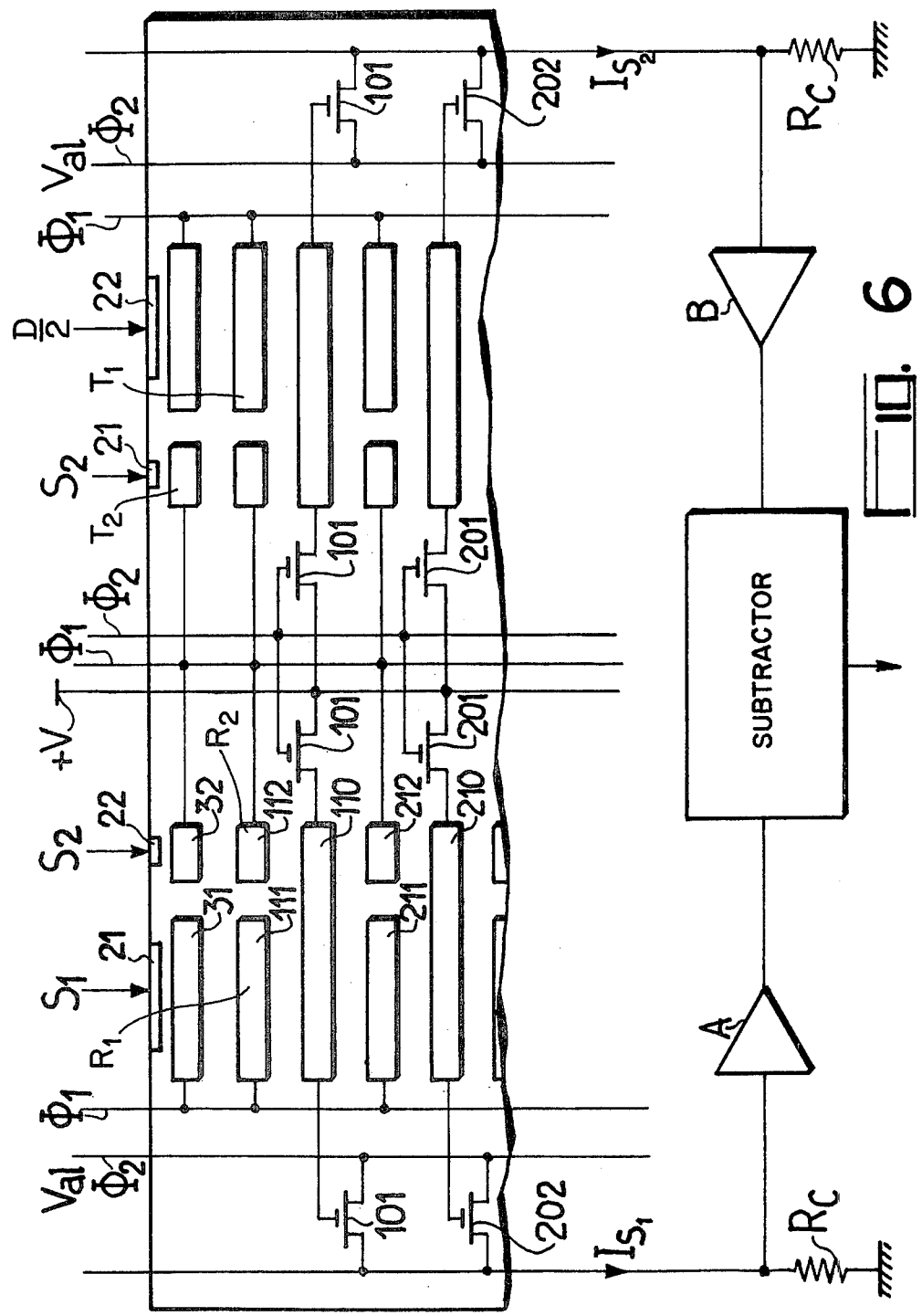
FIG. 6 illustrates a plan view of a second embodiment of the invention.

The last term is the only effective one. The first term is independent of time; by contrast, the first and the second are dependent on time. These terms must be eliminated. This is achieved, in accordance with the invention, by means of the device shown in plan in FIG. 6.

The device comprises, integrated into the same substrate, two assemblies identical to that shown in FIG. 3.

It comprises four registers; only two sets of each of these registers have been illustrated to represent each type. These registers $R_1 - R_2$, $T_1 - T_2$ are identical in pairs and controlled by the same pulses.

A common line supplies the pulses $\phi_1$ to the registers $R_1$ and $T_1$, whilst another common line supplies the pulses $\phi_2$ to the registers $R_2$ and $T_2$.

The register $R_1$ is "frozen" as in the foregoing case and the register $T_1$ receives no signal; in other words, it remains empty and in its case, $s_1 = 0$ so that output $IS_2$ is determined accordingly.

The outputs $I_{S1}$ and $I_{S2}$ of the device supply amplifiers A and B and these two amplifiers in turn supply a circuit which forms the difference between the two signals.

Thus, at the output of the difference circuit appears the signal $$P = C_2\frac{D}{2}K's_1 + c_2\frac{K'}{D}s_1 s_2$$

and the difference circuit will give:

$$P(t) = \sum_{x=1...n} C_2\frac{K'}{2}s_1(x)$$
$$+ \sum_{x=1...n} C_2\frac{K'}{D}s_1(x)s_2(t - \frac{x}{v})$$

The first term is independent of time and can easily be discarded, whilst the second term is the desired correlation product.

What we claim is:

1. A charge coupled correlator device comprising at least a first and a second register, each of these registers comprising a succession of stages and, in each stage at least one phase electrode and an output electrode means for connecting to a fixed potential said output electrode at the instant at which the charges pass from this stage to the next, and for disconnecting the same otherwise, said first register containing at each of said stages the charges corresponding to a first signal which is fixed as a function of time after storage, the second receiving a second signal varying as a function of time and sampled at the rate determined by a clock, the electrodes of said second register having small dimensions compared with those of the first, the output electrodes of each stage in each of the two registers being common and means connected to each of said common output electrodes for generating a third signal which is a function of the correlation product of said first and said second signals.

2. A device as claimed in claim 1, comprising two first and two second registers respectively identical to each other, said two first registers being supplied in parallel with said second signal said second registers receiving respectively said first signals and a fixed potential, said first and second registers respectively forming two pairs, a substractor being provided, having one output which directly yields the correlation product, and having two inputs directly connected to said output electrodes of said two pairs.

3. A device as claimed in claim 2 wherein the registers are integrated into one and the same semiconductor substrate of a given conductivity type, an insulating layer covering said substrate and said phase electrodes being located opposite one another for each pair of registers, said electrodes being respectively constituted by metallised areas deposited upon the oxide layer.

4. A device as claimed in claim 3, wherein an electrically controlled contact breaker connects each output electrode to a source of d.c. potential, and a voltage to current converter for receiving said signals, clock pulses closing said contact breaker and means being provided for adding and applying said currents produced by said voltage-current converters being added and applied to the input of an amplifier.

5. A device as claimed in claim 4, wherein said contact breakers are respectively MOS transistors in which the source is connected to the supply source, the drain to the output electrodes and the gate to a source furnishing pulses capable of blocking said transistors.

6. A device as claimed in claim 4, wherein the voltage-current converters are MOS transistors having gates respectively connected to said output electrodes, drains to a supply source and the sources to said adder devices.

* * * * *